(12) United States Patent
Tsukizawa

(10) Patent No.: US 9,325,288 B2
(45) Date of Patent: Apr. 26, 2016

(54) WIRELESS COMMUNICATION DEVICE

(71) Applicant: Panasonic Corporation, Osaka (JP)

(72) Inventor: Takayuki Tsukizawa, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/400,317

(22) PCT Filed: Mar. 3, 2014

(86) PCT No.: PCT/JP2014/001148
§ 371 (c)(1),
(2) Date: Nov. 10, 2014

(87) PCT Pub. No.: WO2014/141622
PCT Pub. Date: Sep. 18, 2014

(65) Prior Publication Data
US 2015/0111512 A1    Apr. 23, 2015

(30) Foreign Application Priority Data

Mar. 12, 2013  (JP) .................................. 2013-049363

(51) Int. Cl.
*H04B 1/04*    (2006.01)
*H03G 3/30*    (2006.01)
(52) U.S. Cl.
CPC ...... *H03G 3/3042* (2013.01); *H04B 2001/0416* (2013.01)
(58) Field of Classification Search
CPC ... H03G 3/3042; H03G 2201/40; H03G 3/20; H03F 1/30; H03F 1/32; H03F 2200/78; H03F 3/189; H03J 7/02; H04W 52/52

USPC ............ 455/127.2, 138, 239.1, 240.1, 245.1, 455/250.1
See application file for complete search history.

(56) References Cited

U.S. PATENT DOCUMENTS

| 7,239,855 B2 * | 7/2007 | Matsui | .................. H04B 1/005 455/102 |
| 2004/0229583 A1 * | 11/2004 | Ogino | .................. H03G 3/3052 455/136 |
| 2006/0068748 A1 * | 3/2006 | Irie | ........................ H03D 7/145 455/333 |

FOREIGN PATENT DOCUMENTS

| JP | 5-122087 A | 5/1993 |
| JP | 11-274947 A | 10/1999 |
| JP | 2002-76980 A | 3/2002 |
| JP | 2002-246939 A | 8/2002 |
| JP | 2009-89202 A | 4/2009 |

OTHER PUBLICATIONS

International Search Report, mailed Jun. 3, 2014, for International Application No. PCT/JP2014/001148, 2 pages.

* cited by examiner

*Primary Examiner* — Sonny Trinh
(74) *Attorney, Agent, or Firm* — Seed IP Law Group PLLC

(57) ABSTRACT

In a wireless communication device, baseband variable gain amplifiers amplify a baseband signal. Mixers convert the amplified baseband signal into a high-frequency transmission signal. Hybrid variable gain amplifiers amplify an in-phase local signal and an orthogonal local signal which are input to the mixers. The level detection controller changes respective gains of the baseband variable gain amplifiers and the hybrid variable gain amplifiers, in response to power of the high-frequency transmission signal.

10 Claims, 17 Drawing Sheets

FIG.17
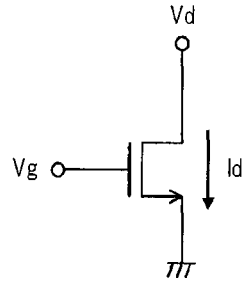
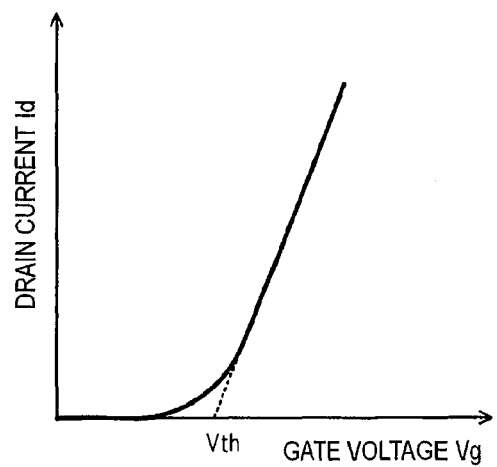
(A)  (B)

WIRELESS COMMUNICATION DEVICE

TECHNICAL FIELD

The present disclosure relates to a wireless communication apparatus that transmits or receives high-frequency signals.

BACKGROUND ART

A technology of making a radio frequency (RF) circuit in a wireless communication field using a micro-wave band or a millimeter wave band from a complementary metal oxide semiconductor (CMOS) has been advanced, and studies about miniaturization and low power consumption for commercialization of the RF circuit have been intended.

The intensity of a transmission wave, that is, the power of the transmission signals is defined in specified low power wireless communications using the millimeter-wave band, for example, a 60 GHz band. In a high-frequency region (for example, a millimeter wave band), the threshold voltage of a transistor constituting an integrated circuit (IC) chip varies depending on a process variation, a temperature fluctuation, or a power voltage fluctuation, such that high frequency characteristics greatly vary. Accordingly, since the power of a transmission signal changes in some cases, the power control of the transmission signal is needed. In other words, it is necessary to control the transmission power to be a constant value by measuring the power of the transmission signal.

For example, Patent Literature 1 and Patent Literature 2 are known as the related arts about a wireless communication apparatus that controls the power of the transmission signal to be constant. A wireless transmitter disclosed in Patent Literature 1 changes a reference voltage to be applied to a digital analog converter (DAC), according to a measurement result of the power of a high-frequency signal, and thus changes a power level of a base-band signal so as to control the level of transmission power of the high-frequency signal to be constant.

In addition, an RF power amplifier disclosed in Patent Literature 2 controls the transmission power level of the high-frequency signal to be constant by applying an automatic power control voltage that is output by an error amplifier connected to a negative feedback circuit and an attenuator, to an RF power amplifier, according to a measurement result of the power of a high-frequency signal. In addition, the operations of the respective apparatuses of Patent Literature 1 and Patent Literature 2 will be described later with reference to FIG. 14 and FIG. 15.

CITATION LIST

Patent Literature

Patent Literature 1: JP-A-5-122087
Patent Literature 2: JP-A-2009-89202

SUMMARY OF INVENTION

Technical Problem

However, in Patent Literature 1 and Patent Literature 2 described above, controlling the respective transmission power of the baseband signals and the high-frequency signals to be constant is disclosed, but controlling the transmission power of a local oscillation signal (local signal) which is input to a mixer circuit that generates a high-frequency signal is not considered.

Accordingly, even though the transmission power of the high-frequency signals is controlled to be constant by changing the power level of the baseband signal, when the power level of the local signal which is input to the mixer circuit varies, it is difficult to control the transmission power of the high-frequency signal to be constant.

In order to solve the problem described above, an object of the present disclosure is to provide a wireless communication apparatus that obtains a high-frequency transmission signal of a desired power, even though a threshold voltage of a transistor varies from the desired value.

Solution to Problem

The present disclosure provides a wireless communication apparatus including a transmission baseband variable gain amplifier that amplifies a transmission baseband signal, a transmission mixer that converts the amplified transmission baseband signal into a high-frequency transmission signal, a transmission local variable gain amplifier that amplifies a local signal that is input to the transmission mixer, and a controller that changes respective gains of the transmission baseband variable gain amplifier and the transmission local variable gain amplifier, in response to power of the high-frequency transmission signal.

The present disclosure also provides a wireless communication apparatus including a transmission circuit that generates a high-frequency transmission signal by using a local signal and a transmission baseband signal, a reception circuit that generates a baseband reception signal by using a high-frequency reception signal as received and the local signal, and a controller that changes each gain for amplifying the transmission baseband signal and the local signal, in response to power of the high-frequency transmission signal, wherein the controller uses a same value as a control signal value for setting a gain after a change for amplifying the local signal which is input to the transmission circuit, or a value obtained by adding or subtracting a predetermined value to or from the control signal value, as a control signal value for setting a gain for amplifying the local signal which is input to the reception circuit.

Advantageous Effects of Invention

According to the present disclosure, it is possible to obtain a high-frequency transmission signal of a desired power, even though a threshold voltage of a transistor varies from the desired value.

BRIEF DESCRIPTION OF DRAWINGS

FIG. 17(A) is an equivalent circuit diagram of a transistor, and FIG. 17(B) is a graph illustrating a drain current characteristic with respect to a gate voltage of the transistor.

DESCRIPTION OF EMBODIMENTS (Background of Respective Embodiments)

Figure 14:
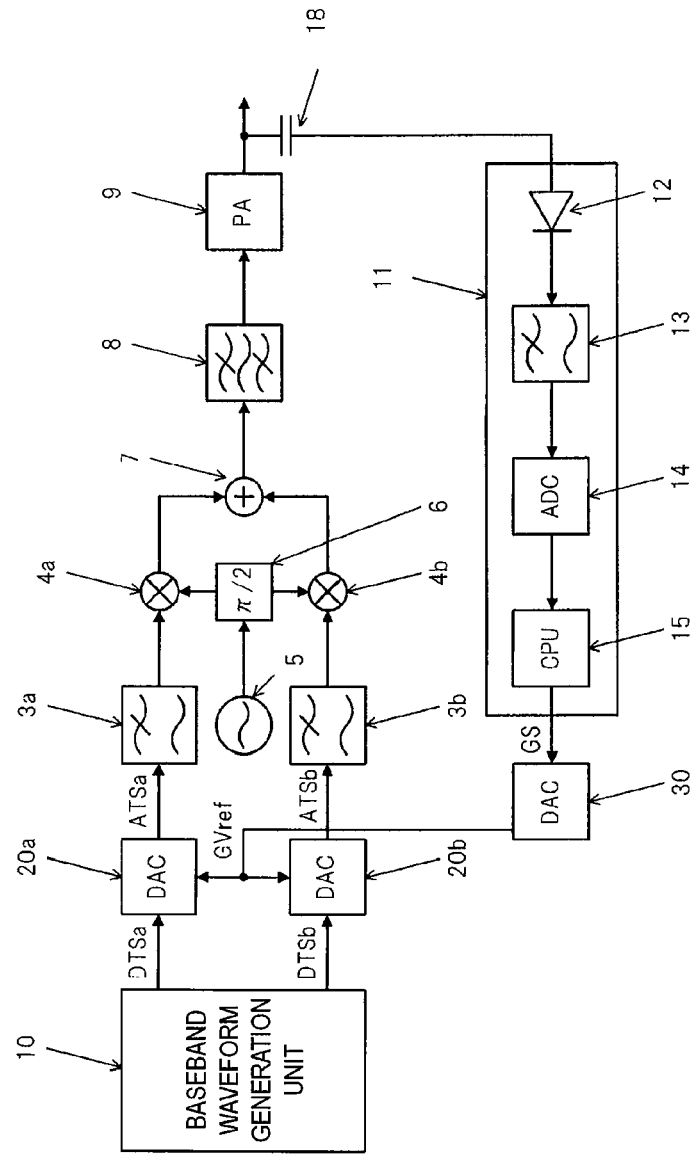
FIG. 14 is a diagram illustrating an example of a circuit configuration of a wireless communication apparatus in the related art.
Figure 15:
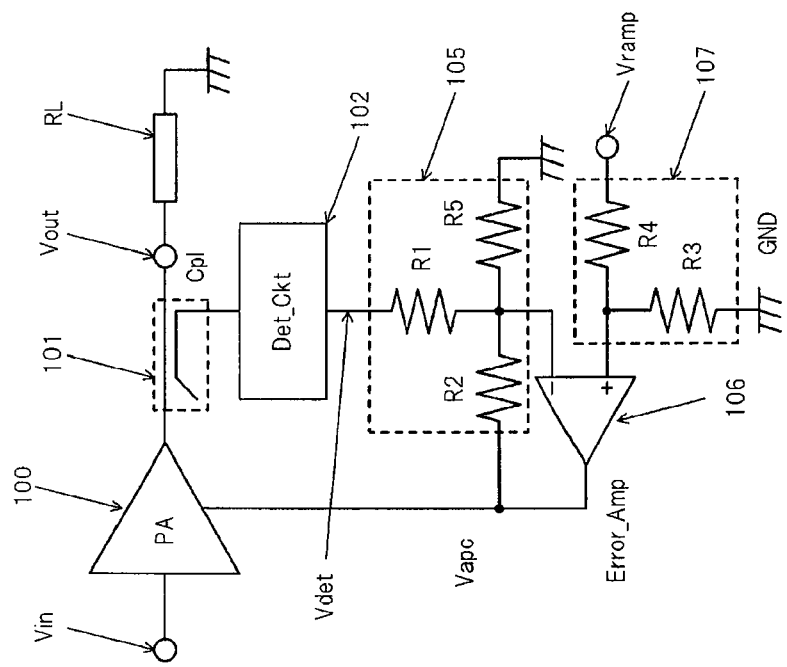
FIG. 15 is a diagram illustrating another example of a circuit configuration of a wireless communication apparatus in the related art.

First, before describing the respective embodiments of a wireless communication apparatus of the present disclosure, a background of each embodiment will be described with reference to FIG. 14 to FIG. 17. FIG. 14 is a diagram illustrating an example of a circuit configuration of a wireless communication apparatus in the related art (see Patent Literature 1). FIG. 15 is a diagram illustrating another example of a circuit configuration of a wireless communication apparatus in the related art (see Patent Literature 2).

In FIG. 14, the respective baseband signals DTSa and DTSb with phases orthogonal to each other, which are generated by a baseband waveform generation unit 10, are transformed into analog signal waveforms in DACs 20a and 20b, and the analog signal waveforms are input to mixers 4a and 4b after unnecessary frequency components are removed by low pass filters 3a and 3b.

In the mixers 4a and 4b, analog baseband signals ATSa and ATSb are mixed with a local oscillation signal which is generated by a local oscillator 5 and a π/2 phase shifter 6, and thus carriers which have been subjected to quadrature modulation by the analog baseband signals ATSa and ATSb are obtained. The modulated waves are added in adder 7, the added wave is input to a transmission power amplifier 9 such that the power of the waves is amplified after unnecessary frequency components other than a band are removed by a band pass filter 8, and amplified wave is transmitted from an antenna, not shown.

Here, when it is assumed that the transmission power of the modulated wave is varied for some reason during a transmission operation, a variation level of the transmission power is compared with a predetermined threshold and detected by a CPU 15 in an APC circuit 11. The APC circuit 11 is connected in series with a loosely coupled capacitor 18, and includes a rectifier circuit 12, a low pass filter 13, an ADC 14, and the CPU 15.

The CPU 15 generates digital gain control information GS for cancelling a detected variation level and outputs the digital gain control information GS to a DAC 30. When the digital gain control information GS is output from the CPU 15, the DAC 30 generates an analog voltage corresponding to the digital gain control information GS, and supplies the DACs 20a and 20b with the generated analog voltage as a reference voltage GVref. The DACs 20a and 20b change a direct current gain depending on a change in the reference voltage GVref.

Thus, the direct current gain of the modulated wave changes, which is obtained by mixing the analog baseband signals ATSa and ATSb with the local oscillation signal, and the transmission power level of the modulated wave changes, which is output from the transmission power amplifier 9. The transmission power level of the modulated wave is controlled so as to be a constant level corresponding to a predetermined threshold which has been already set in the CPU 15.

Further, in FIG. 15, a transmission output level indication voltage Vramp is applied to a non-inverting input terminal of an error amplifier 106 that controls the gain of an RF power amplifier 100, through an attenuator 107 having resistors R3 and R4. The error amplifier 106 controls the gain of the RF power amplifier 100, using an automatic power control voltage Vapc. A negative feedback circuit 105 provided between an output terminal and an inverted input terminal of the error amplifier 106 has a first resistor R1, a second resistor R2, and a third resistor R5.

When the transmission power detected by a power detector 102 is low, the attenuator 107 mitigates an increase in the transmission power Pout due to an increase in the transmission output level indication voltage Vramp. Meanwhile, when the transmission power detected by the power detector 102 is moderate or high, the control sensitivity of change in the automatic power control voltage Vapc due to a change in the transmission output level indication voltage Vramp is improved by the third resistor R5. Thus, the power of the high-frequency signal is controlled by the automatic power control voltage Vapc which is input to the RF power amplifier 100, according to the transmission power detected by a power detector 102, such that power control with high accuracy is possible.

In this manner, the wireless communication apparatuses in the related art are capable of performing stable power control by controlling a gain of a DAC of a baseband band or an amplifier, or a gain of a power amplifier.

However, in the wireless communication apparatuses in the related art illustrated in FIG. 14 and FIG. 15, controlling the respective power levels of the baseband signal and the high-frequency signal are described, but controlling the power level of the local signal which is input to the mixer circuit that generates a high-frequency signal is not considered.

Figure 16:
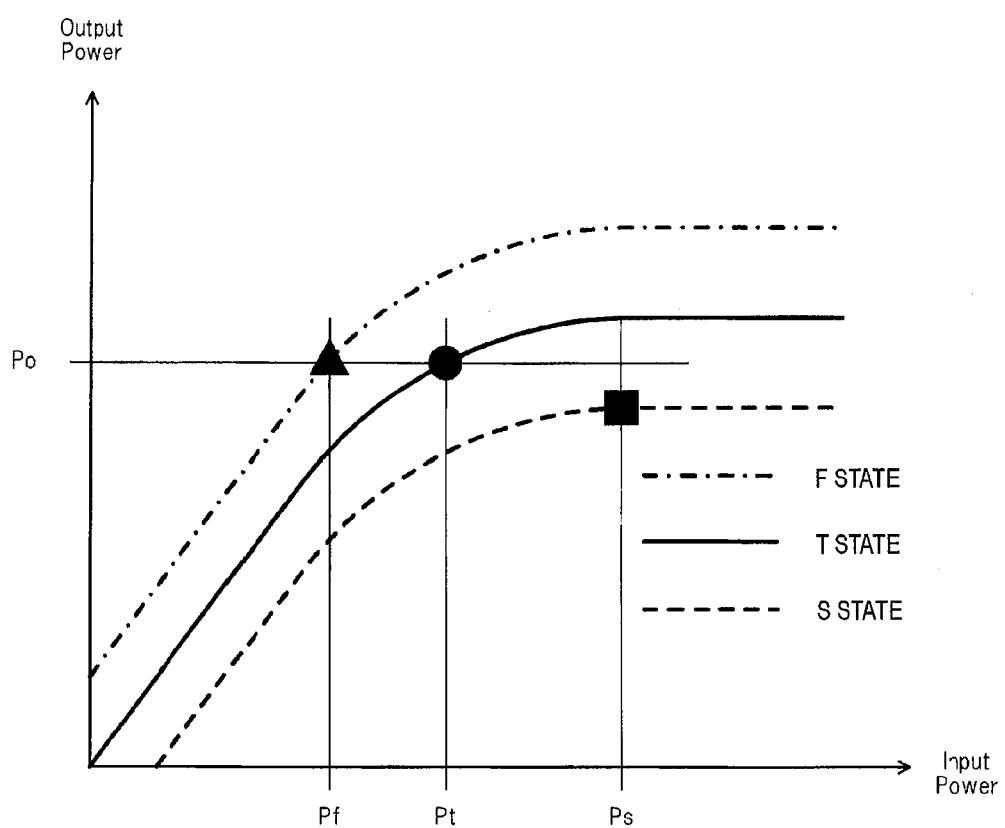
FIG. 16 is a graph illustrating power characteristics between input-output signals according to a variation in a manufacturing process of a transistor.

Further, when the characteristics of an integrated circuit (IC) chip in which the circuit components of the wireless communication apparatus described above are mounted vary due to a process variation during the manufacture, the wireless communication apparatus has difficulties in obtaining the desired power Po in the high-frequency transmission signal in some cases (see FIG. 16). FIG. 16 is a graph illustrating power characteristics between input-output signals according to a manufacturing variation of a transistor, and FIG. 17(A) is an equivalent circuit diagram of the transistor, and FIG. 17(B) is a graph illustrating a drain current characteristic with respect to a gate voltage of the transistor.

FIG. 17(B) illustrates a characteristic between a gate voltage Vg and a drain current Id of the transistor illustrated in FIG. 17(A). When the gate voltage Vg exceeds a threshold voltage Vth, the drain current Id flows. In the transistor, the threshold voltage Vth varies due to the process variation, and thus when the threshold voltage Vth is low, the drain current Id increases; and when the threshold voltage Vth is high, the drain current Id decreases.

Further, when the threshold voltage Vth is low, the maximum operating frequency fmax of the transistor increases; and when the threshold voltage Vth is high, the maximum operating frequency fmax decreases, such that when the maximum operating frequency fmax is high, the high-frequency characteristic of the transistor is good. In FIG. 16, a state in which the threshold voltage Vth is low is represented as a Fast (F) state, a state in which the threshold voltage Vth is high is represented as a Slow (S) state, and a state in which the threshold voltage Vth is a center value (a typical value or an average value) is represented as a Typical (T) state.

In order for the wireless communication apparatus to obtain the desired power Po in the high-frequency transmission signal, the input power may be Pf in the F state and Pt in the T state. However, since the maximum operating frequency fmax is decreased in the S state, no matter how much the input power is increased, it is difficult to obtain the desired power Po.

Here, when the operating frequency of a circuit of a wireless communication apparatus using a millimeter wave is not sufficiently lower compared to the maximum operating frequency fmax in the S state (for example, more than $1/10$), the gain of the amplification circuit tends to decrease. In this manner, when the wireless communication apparatus uses, for example, a high-frequency signal (for example, a millimeter wave), even though the power control of a transmission signal of a high frequency is performed as in Patent Literature 1 or Patent Literature 2, there is a problem that it is difficult to obtain the desired power Po in the S state.

Thus, the following respective embodiments describe examples of a wireless communication apparatus which obtains a high-frequency transmission signal of a desired power, even though the threshold voltage of the transistor used in the IC chip varies from the desired value (for example, a typical value or a center value) and the wireless communication apparatus is, for example, in the S state in which the threshold voltage is high.

(First Embodiment)

Figure 1:
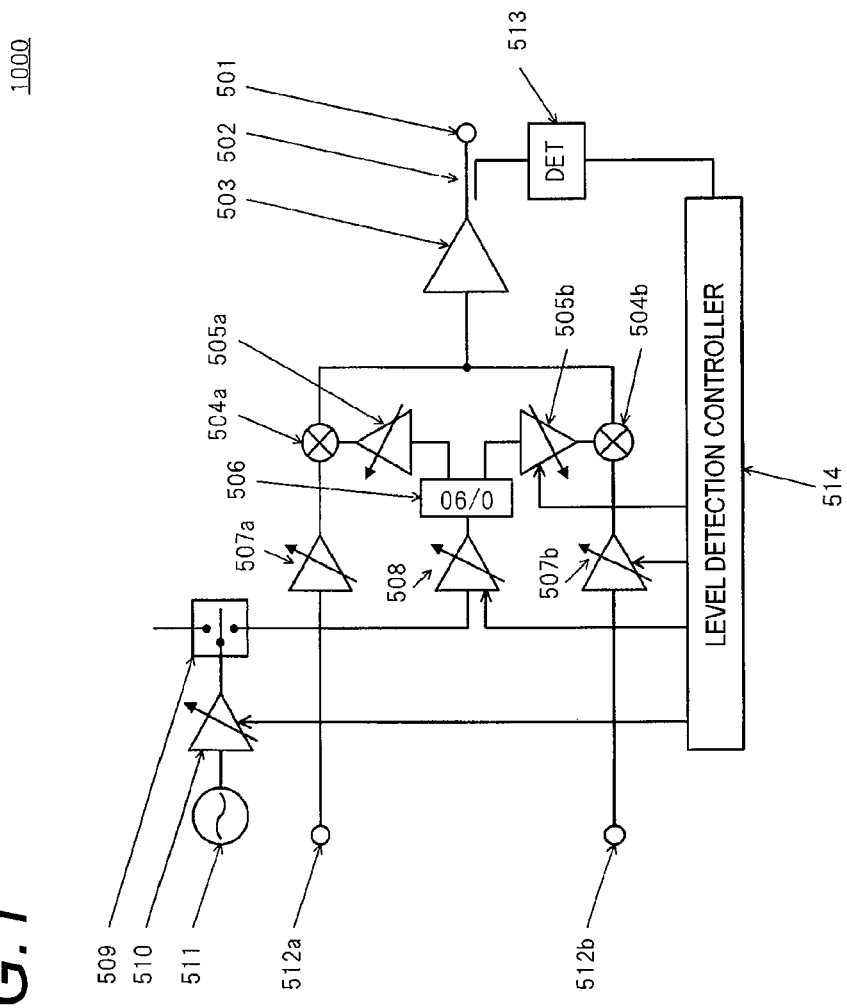
FIG. 1 is a diagram illustrating a circuit configuration of a wireless communication apparatus of a first embodiment.

FIG. 1 is a diagram illustrating a circuit configuration of a wireless communication apparatus 1000 according to a first embodiment. The wireless communication apparatus 1000 illustrated in FIG. 1 is illustrated focusing on a circuit configuration as a transmitter.

The wireless communication apparatus 1000 illustrated in FIG. 1 includes baseband variable gain amplifiers 507a and 507b, mixers 504a and 504b, a voltage controlled oscillator (VCO) 511, a VCO variable gain amplifier 510, a local switch 509, a local variable gain amplifier 508, a 90-degree hybrid phase shifter 506, hybrid variable gain amplifiers 505a and 505b, a power amplifier (PA) 503, a coupler 502, a power detector (DET) 513, and a level detection controller 514.

The baseband variable gain amplifiers 507a and 507b which are transmission baseband variable gain amplifiers receive and amplify an in-phase analog baseband signal and an orthogonal analog baseband signal of which phases are orthogonal to each other, that is, with a 90-degree phase difference, through input terminals 512a and 512b. The baseband variable gain amplifiers 507a and 507b change respective gains, in response to a control signal value of a control signal generated by the level detection controller 514, which will be described later. The in-phase analog baseband signal and the orthogonal analog baseband signal which have been amplified are respectively input to the mixers 504a and 504b.

The voltage controlled oscillator 511 generates a local oscillation signal (local signal) of a predetermined frequency in the wireless communication apparatus 1000, in response to the applied control voltage, and outputs the local signal to the VCO variable gain amplifier 510. The predetermined frequency is, for example, 60 GHz (a millimeter-wave).

The VCO variable gain amplifier 510 which is the VCO variable gain amplifier amplifies the local signal generated by the voltage controlled oscillator 511, and outputs the amplified local signal to the local switch 509. The VCO variable gain amplifier 510 changes the gain, in response to the control signal value of the control signal generated by the level detection controller 514, which will be described later.

The local switch 509 outputs the local signal amplified by the VCO variable gain amplifier 510 to the local variable gain amplifier 508 or other circuits, in response to a control signal that is output from a control circuit, not shown.

The local variable gain amplifier 508 amplifies and outputs the local signal amplified by the VCO variable gain amplifier 510 to the 90-degree hybrid phase shifter 506, through the local switch 509. The local variable gain amplifier 508 changes a gain, in response to a control signal value of a control signal generated by the level detection controller 514 which will be described later.

The 90-degree hybrid phase shifter 506 which is a phase shifter generates an in-phase local signal and an orthogonal local signal of which phases are orthogonal to each other, based on the local signal amplified by the local variable gain amplifier 508, and outputs the in-phase local signal to the hybrid variable gain amplifier 505a, and the orthogonal local signal to the hybrid variable gain amplifier 505b.

The hybrid variable gain amplifier 505a which is the hybrid variable gain amplifier amplifies the in-phase local signal generated by the 90-degree hybrid phase shifter 506 and outputs the amplified signal to the mixer 504a. The hybrid variable gain amplifier 505a changes a gain, in response to a control signal value of a control signal generated by the level detection controller 514, which will be described later.

The hybrid variable gain amplifier 505b which is a hybrid variable gain amplifier amplifies the orthogonal local signal generated by the 90-degree hybrid phase shifter 506, and outputs the amplified signal to the mixer 504b. The hybrid variable gain amplifier 505b changes a gain, in response to a control signal value of a control signal generated by the level detection controller 514, which will be described later.

In addition, the VCO variable gain amplifier 510, the local variable gain amplifier 508, and the hybrid variable gain amplifiers 505a and 505b amplify the power of the local signals (including the in-phase local signal and the orthogonal local signal) and constitute a transmission local variable gain amplifier.

The mixer 504a which is a transmission mixer generates an in-phase transmission signal (carrier) of a high frequency by performing quadrature modulation by using the in-phase analog baseband signal amplified by the baseband variable gain amplifier 507a and the in-phase local signal amplified by the hybrid variable gain amplifier 505a, and outputs the modulated signal to the power amplifier 503.

The mixer 504b which is a transmission mixer generates an orthogonal transmission signal (carrier) of a high frequency by performing quadrature modulation by using the orthogonal analog baseband signal amplified by the baseband variable gain amplifier 507b and the orthogonal local signal amplified by the hybrid variable gain amplifier 505b, and outputs the modulated signal to the power amplifier 503. In addition, the in-phase transmission signal of a high frequency and the orthogonal transmission signal of a high frequency are added and input to the power amplifier 503.

The power amplifier 503 amplifies a high-frequency transmission signal obtained by adding the in-phase transmission signal of a high frequency and the orthogonal transmission signal of a high frequency which are generated by the mixers 504a and 504b, and outputs the amplified signal to an output terminal 501 through the coupler 502. The output terminal 501 is connected to a transmission antenna which is not shown. The high-frequency transmission signal amplified by the power amplifier 503 is supplied to the transmission antenna and is radiated into the air as radio waves.

The coupler 502 is configured by using, for example, a directional coupler, extracts a portion of the high-frequency transmission signal amplified by the power amplifier 503, and outputs the extracted signal to the power detector 513.

The power detector 513 detects the high-frequency transmission signal extracted by the coupler 502, and outputs the power (level) of the high-frequency transmission signal which is a detected output, to the level detection controller 514.

The level detection controller 514 which is a controller generates a control signal for changing the respective gains of the baseband variable gain amplifiers 507a and 507b and at least one of the VCO variable gain amplifier 510, the local variable gain amplifier 508 and the hybrid variable gain amplifiers 505a and 505b, in response to the power (level) of the high-frequency transmission signal which is the detected output of the power detector 513. The control signal contains a control signal value for setting a gain after a change.

The level detection controller 514 generates and outputs a control signal containing a control signal value for setting each gain after the change, with respect to each variable gain amplifier to be changed in which the gain is changed, among the baseband variable gain amplifiers 507a and 507b, the VCO variable gain amplifier 510, the local variable gain amplifier 508 and the hybrid variable gain amplifiers 505a and 505b. In addition, a circuit configuration of the level detection controller 514 will be described with reference to FIG. 6. Further, the level detection controller 514 may generate and output or may not generate and output a control signal containing a control signal value for setting each gain which has been set at present, with respect to each variable gain amplifier of which the gain is not to be changed.

Thus, the level detection controller 514 can adjust the power (level) of the in-phase analog baseband signal and the orthogonal analog baseband signal which are input to the mixers 504a and 504b to an appropriate target value, by changing the gains of the baseband variable gain amplifiers 507a and 507b.

Further, the level detection controller 514 can adjust the power (level) of the in-phase local signal and the orthogonal local signal which are input to the mixers 504a and 504b to an appropriate target value, by changing the gain of at least one of the VCO variable gain amplifier 510, the local variable gain amplifier 508, and the hybrid variable gain amplifiers 505a and 505b.

Figure 2:
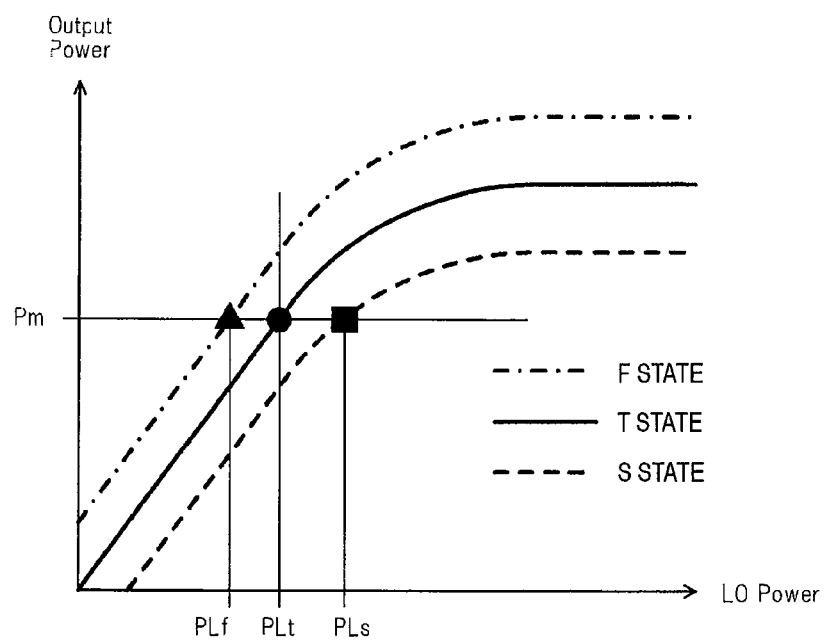
FIG. 2 is a graph illustrating power characteristics between a local signal which is input to a mixer and a high-frequency signal which is output from the mixer.

FIG. 2 is a graph illustrating the power characteristics between the local signal which is input to the mixers 504a and 504b and the high-frequency signal which is output from the mixers 504a and 504b. The solid line shown in FIG. 2 represents the power characteristic at the T state in which the threshold voltage Vth of the transistor used in the mixers 504a and 504b is a typical value (center value), and the dash-dot line shown in FIG. 2 represents the power characteristic at the F state in which the threshold voltage Vth of the transistor used in the mixers 504a and 504b is a low value. The dotted line shown in FIG. 2 represents the power characteristic at the S state in which the threshold voltage Vth of the transistor used in the mixers 504a and 504b is a high value.

In FIG. 2, the characteristics of power (output power) of the high-frequency transmission signals with respect to the power (input signal) of the local signals which are input to the mixers 504a and 504b are different due to the process variation.

Specifically, when it is assumed that the input power of the local signal is PLt, the output power is a target power Pm at the T state, but the output power is higher than the target power Pm at the F state, and is lower than the target power Pm at the S state. In other words, when the input power of the local signal is constant, the output power of the mixers 504a and 504b decreases at the S state, such that the output power of the power amplifier 503 may not reach the desired power Po in some cases.

In the present embodiment, the wireless communication apparatus 1000 changes the gain of at least one of the VCO variable gain amplifier 510, the local variable gain amplifier 508 and the hybrid variable gain amplifiers 505a and 505b, in order to change the input power of the local signal which is input to the mixers 504a and 504b.

Thus, the wireless communication apparatus 1000 can obtain the desired output power Pm of the high-frequency transmission signal by changing the power of the local signal at the F state to be an input power PLf which is lower than that at the T state and changing the power of the local signal at the S state to be an input power PLs which is higher than that at the T state.

Figure 3:
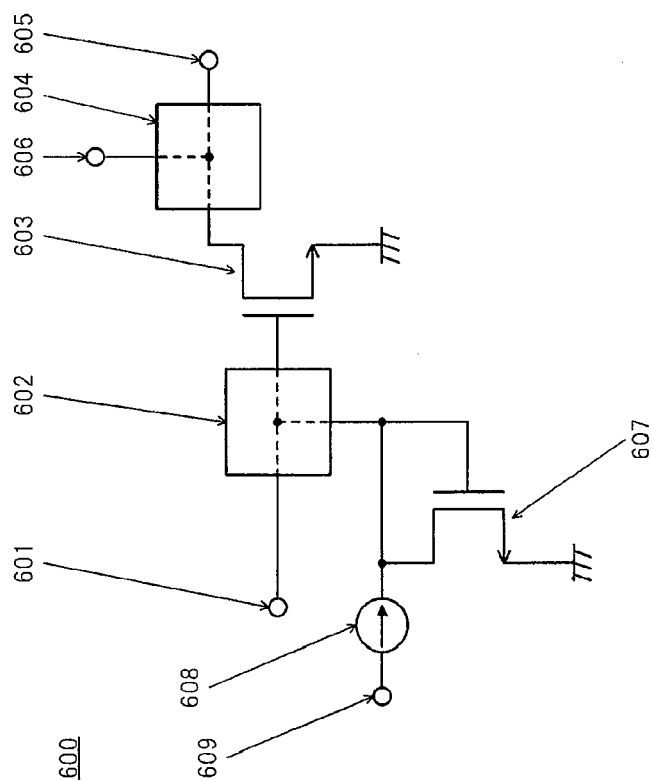
FIG. 3 is an example of an equivalent circuit diagram of a baseband variable gain amplifier, a VCO variable gain amplifier, a local variable gain amplifier and a hybrid variable gain amplifier.

FIG. 3 is an example of an equivalent circuit diagram of the VCO variable gain amplifier 510, the local variable gain amplifier 508 and the hybrid variable gain amplifiers 505a and 505b. The VCO variable gain amplifier 510, the local variable gain amplifier 508 and the hybrid variable gain amplifiers 505a and 505b commonly have, for example, the circuit configuration of the variable gain amplifier 600 illustrated in FIG. 3.

The variable gain amplifier 600 illustrated in FIG. 3 includes an input terminal 601, an input matching circuit 602, an amplification transistor 603, an output matching circuit 604, an output terminal 605, an output bias terminal 606, a current mirror transistor 607, a reference current source circuit 608, and a current source terminal 609. The amplification transistor 603 and the current mirror transistor 607 constitute a current mirror, and are source grounded.

In FIG. 3, an input signal is input to the input terminal 601, passes through the input matching circuit 602, is amplified in the amplification transistor 603, passes through the output matching circuit 604, and is output from the output terminal 605.

Figure 4:
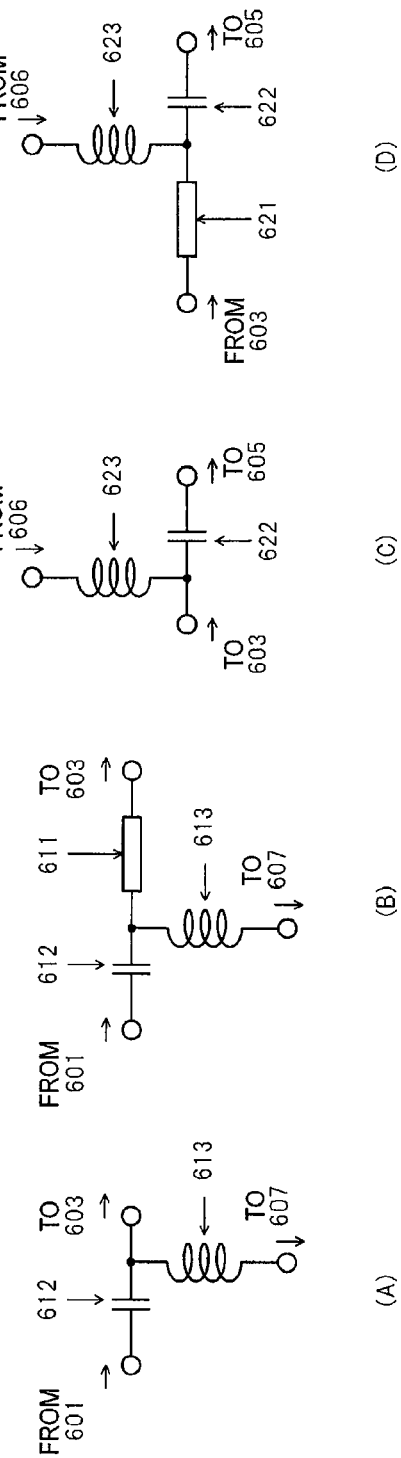
FIGS. 4(A) and 4(B) are equivalent circuit diagrams of an input matching circuit of the variable gain amplifier illustrated in FIG. 3, and FIGS. 4(C) and 4(D) are equivalent circuit diagrams of an output matching circuit of the variable gain amplifier illustrated in FIG. 3.

FIGS. 4(A) and (B) are equivalent circuit diagrams of the input matching circuit 602 of the variable gain amplifier 600 illustrated in FIG. 3. The input matching circuit 602 shown in FIG. 4(A) is configured in such a manner that a capacitor 612 is connected in series thereto, and an inductor 613 is connected in parallel to a connection point between the capacitor 612 and the amplification transistor 603. The input matching circuit 602 shown in FIG. 4(B) is configured in such a manner that the capacitor 612 and a transmission line 611 are connected in series thereto, and the inductor 613 is connected in parallel to a connection point between the capacitor 612 and the transmission line 611. With respect to the input matching circuit 602, for example, the circuit configurations illustrated in FIG. 4(A) or FIG. 4(B) are used depending on the usage of the variable gain amplifier 600.

FIGS. 4(C) and (D) are equivalent circuit diagrams of output matching circuit 604 of the variable gain amplifier 600 illustrated in FIG. 3. The output matching circuit 604 shown in FIG. 4(C) is configured in such a manner that a capacitor 622 is connected in series thereto, and an inductor 623 is connected in parallel to a connection point between the capacitor 622 and the amplification transistor 603. The output matching circuit 604 shown in FIG. 4(D) is configured in such a manner that a transmission line 621 and the capacitor 622 are connected in series thereto, and the inductor 623 is connected in parallel to a connection point between the transmission line 621 and the capacitor 622. With respect to the output matching circuit 604, for example, the circuit configurations illustrated in FIG. 4(C) or FIG. 4(D) are used depending on the usage of the variable gain amplifier 600.

The gate terminal of the amplification transistor 603 is connected to the gate terminal of the current mirror transistor 607 and the reference current source circuit 608 through the input matching circuit 602. A DC gate bias voltage is applied to the gate terminal of the amplification transistor 603 and the gate terminal of the current mirror transistor 607, according to the reference voltage that the reference current source circuit 608 outputs based on the signal applied to the current source terminal 609.

A drain voltage is applied to the drain terminal of the amplification transistor 603 from the output bias terminal 606, through the output matching circuit 604. As described above, the amplification transistor 603 and the current mirror transistor 607 constitute a current mirror, and the current value of the variable gain amplifier 600, that is, the current value flowing to the output bias terminal 606 is determined by the ratio of the sizes of the amplification transistor 603 and the current mirror transistor 607, and the output current of the reference current source circuit 608. Since the gain of the variable gain amplifier 600 is determined by the current value flowing to the output bias terminal 606, it is possible to change the gain by changing the ratio of the sizes of the amplification transistor 603 and the current mirror transistor 607, and the output current of the reference current source circuit 608.

Figure 5:
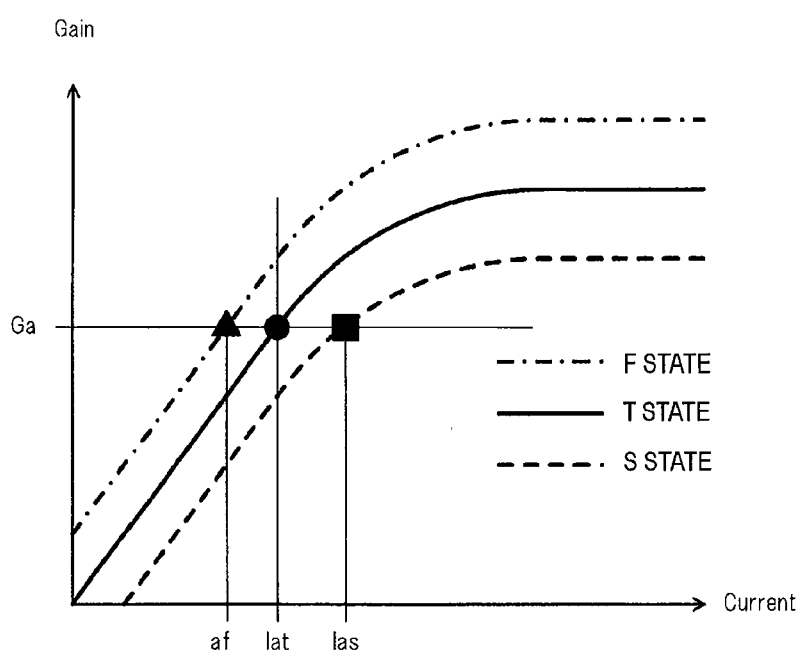
FIG. 5 is a graph illustrating a gain characteristic with respect to a current value of the variable gain amplifier illustrated in FIG. 3.

FIG. 5 is a graph illustrating a gain characteristic with respect to a current value of the variable gain amplifier 600 illustrated in FIG. 3. The solid line shown in FIG. 5 represents the gain characteristic at the T state in which the threshold voltage Vth of the amplification transistor 603 and the current mirror transistor 607 is a typical value (center value), and the dash-dot line shown in FIG. 5 represents the gain characteristic at the F state in which the threshold voltage Vth of the amplification transistor 603 and the current mirror transistor 607 is a low value. The dotted line shown in FIG. 5 represents the gain characteristic at the S state in which the threshold voltage Vth of the amplification transistor 603 and the current mirror transistor 607 is a high value.

The horizontal axis of FIG. 5 represents the current value of the variable gain amplifier 600. The vertical axis of FIG. 5 represents the gain of the variable gain amplifier 600. In FIG. 5, when the current value of the variable gain amplifier 600 increases, the gain of the variable gain amplifier 600 increases. Further, the gain characteristic of the variable gain amplifier 600 varies depending on the process variation.

Specifically, when it is assumed that the current value of the variable gain amplifier 600 is Iat, the gain of the variable gain amplifier 600 is the target value Ga at the T state, but is higher than the target value Ga at the F state, and is lower than the target value Ga at the S state.

In the present embodiment, the variable gain amplifier 600 can obtain the gain of the target value Ga of the variable gain amplifier 600, by changing the current value of the variable gain amplifier 600 at the F state to be a current value Iaf which is lower than that at the T state and changing the current value of the variable gain amplifier 600 at the S state to be a current value Ias which is higher than that at the T state. In other words, the variable gain amplifier 600 can change the gain by changing the current value of the variable gain amplifier 600, and can adjust the output power of the mixers 504a and 504b to be constant, irrespective of the process variation.

Figure 6:
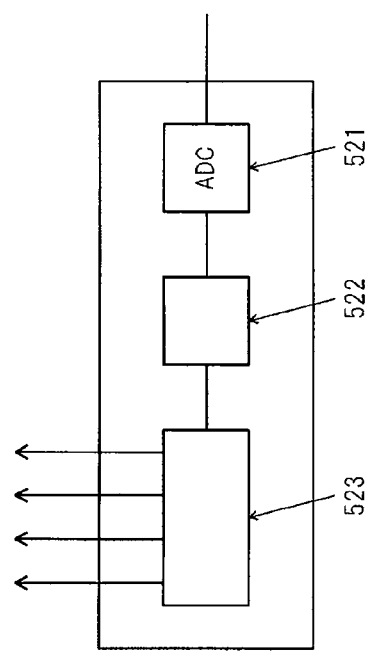
FIG. 6 is a block diagram illustrating an example of an internal configuration of a level detection controller.

FIG. 6 is a block diagram illustrating an example of an internal configuration of the level detection controller 514. The level detection controller 514 illustrated in FIG. 6 includes an analog digital converter (ADC) 521, a level comparison unit 522, and a level controller 523.

The analog digital converter 521 converts the power (or level) of the analog high-frequency transmission signal which is the detection output of the power detector 513 into a digital value corresponding to the power (or level), and outputs the digital value to the level comparison unit 522.

The level comparison unit 522 calculates (detects) the output power POUT of the power amplifier 503 from the output value (a digital code or a digital value) of the analog digital converter 521, and outputs a comparison result obtained by comparing the output power POUT of the power amplifier 503 and a predetermined reference output power Pdef to the level controller 523.

The level controller 523 generates a control signal containing a control signal value for setting each gain after the change, with respect to each variable gain amplifier to be changed in which the gain is changed, among the baseband variable gain amplifiers 507a and 507b, the VCO variable gain amplifier 510, the local variable gain amplifier 508 and the hybrid variable gain amplifiers 505a and 505b, in response to the comparison result of the output power POUT of the power amplifier 503 and the reference output power Pdef.

The level controller 523 outputs the generated control signal to each variable gain amplifier to be changed in which the gain is changed, among the baseband variable gain amplifiers 507a and 507b, the VCO variable gain amplifier 510, the local variable gain amplifier 508 and the hybrid variable gain amplifiers 505a and 505b. Further, the reference output power Pdef may be input to the level comparison unit 522 from the outside, or may be stored in advance in the level comparison unit 522.

Figure 7:
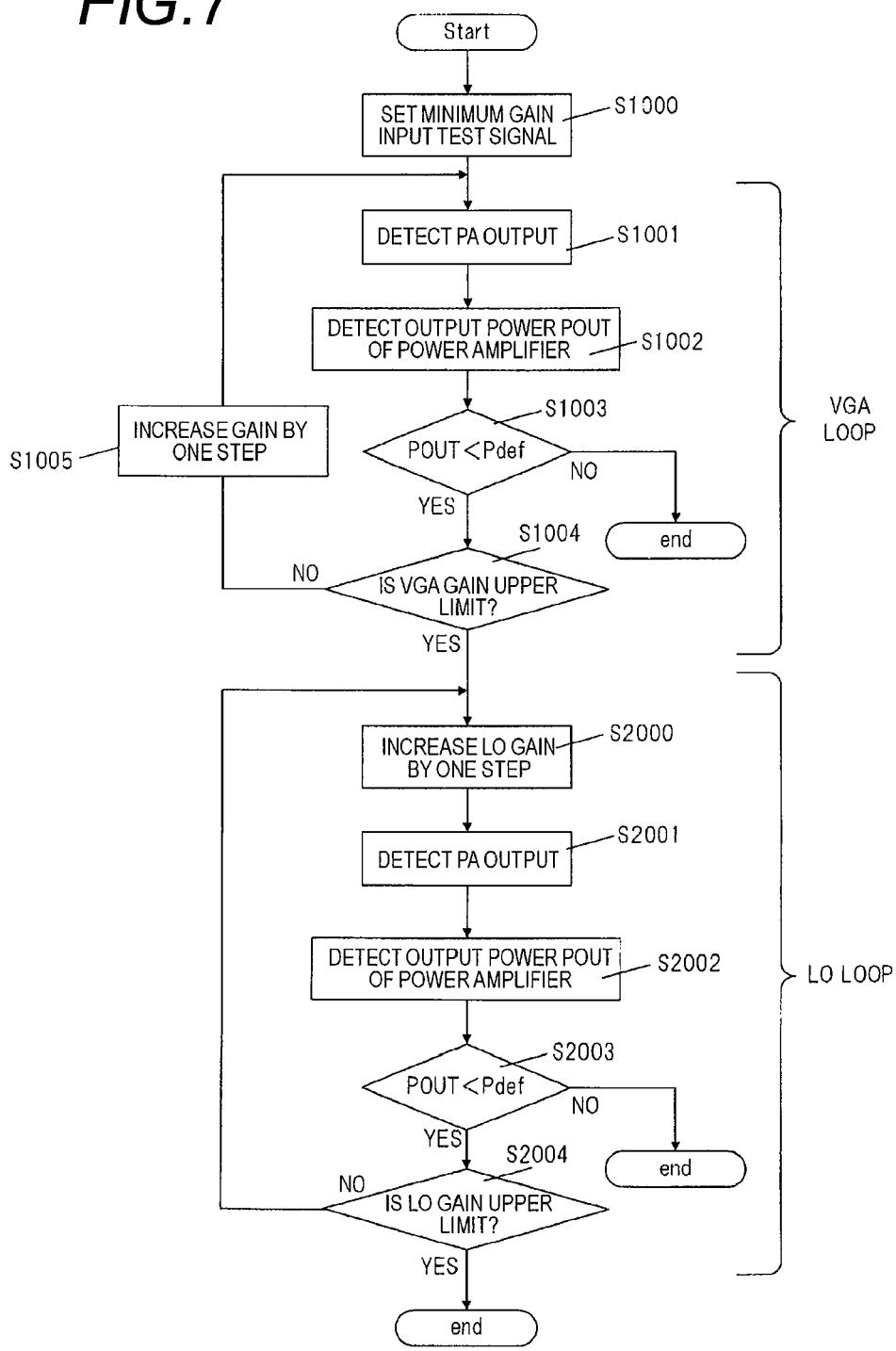
FIG. 7 is a flow chart describing the detailed contents of a power control operation of a transmission signal in the wireless communication apparatus of the first embodiment.

FIG. 7 is a flow chart describing the detailed contents of a power control operation of a transmission signal in the wireless communication apparatus 1000 of the first embodiment. In FIG. 7, "VGA LOOP", that is, an operation for changing the respective gains of the baseband variable gain amplifiers 507a and 507b is first started, and after "VGA LOOP", "LO LOOP", that is, an operation for changing each gain of at least one of the VCO variable gain amplifier 510, the local variable gain amplifier 508, and the hybrid variable gain amplifiers 505a and 505b is started.

In FIG. 7, for example, the gains of the baseband variable gain amplifiers 507a and 507b, the VCO variable gain amplifier 510, the local variable gain amplifier 508, the hybrid variable gain amplifiers 505a and 505b are set to the minimum values (initial values) (S1000). Further, a test baseband transmission signal is input to the input terminals 512a and 512b (S1000).

Here, the test baseband transmission signal may be a modulation signal which is actually used by the wireless communication apparatus 1000, or a continuous wave (CW: unmodulated continuous wave) signal.

The mixer 504a generates an in-phase transmission signal of a high frequency by performing quadrature modulation by using an in-phase analog baseband signal that is amplified by the baseband variable gain amplifier 507a and an in-phase local signal that is amplified by the hybrid variable gain amplifier 505a, and outputs the generated in-phase transmission signals to the power amplifier 503.

Further, the mixer 504b generates an orthogonal transmission signal of a high frequency by performing quadrature modulation by using an orthogonal analog baseband signal that is amplified by the baseband variable gain amplifier 507b and an orthogonal local signal that is amplified by the hybrid variable gain amplifier 505b, and outputs the generated orthogonal transmission signal to the power amplifier 503.

The power amplifier 503 amplifies the high-frequency transmission signal obtained by adding the in-phase transmission signal of a high frequency and the orthogonal transmission signal of a high frequency which are generated by the mixers 504a and 504b, and outputs the amplified signal to the output terminal 501 through the coupler 502.

The power detector 513 detects the high-frequency transmission signal which is extracted by the coupler 502 (S1001), and outputs the power (level) of the high-frequency transmission signal which is the detected result, to the level detection controller 514.

The level detection controller 514 converts the power (level) of the analog high-frequency transmission signal which is the detected output of the power detector 513 into a digital value corresponding to the power (or level), and detects the output power POUT of the power amplifier 503 (S1002).

The level detection controller 514 compares the output power POUT of the power amplifier 503 with a predetermined reference output power Pdef (S1003). When the output power POUT of the power amplifier 503 is greater than the reference output power Pdef (in S1003, NO), the output power POUT of the power amplifier 503 exceeds the desired power, and thus the power control operation of the transmission signal in the wireless communication apparatus 1000 illustrated in FIG. 7 is ended.

In contrast, when it is determined that the output power POUT of the power amplifier 503 is smaller than the reference output power Pdef (in S1003, YES), the level detection controller 514 determines whether the VGA gains, that is, the gains of the baseband variable gain amplifiers 507a and 507b are the upper limit value (S1004).

When it is determined that the gains of the baseband variable gain amplifiers 507a and 507b are not the upper limit value (in S1004, NO), the level detection controller 514 generates a control signal containing a control signal value for increasing the respective gains of the baseband variable gain amplifiers 507a and 507b by one step, and outputs the control signal to the baseband variable gain amplifiers 507a and 507b. The baseband variable gain amplifiers 507a and 507b increase the respective present gains by one step, in response to the control signal generated by the level detection controller 514 (S1005). After step S1005, the operation of the wireless communication apparatus 1000 proceeds to step S1001.

When it is determined that the gains of the baseband variable gain amplifiers 507a and 507b are the upper limit value (in S1004, YES), the level detection controller 514 ends "VGA LOOP", and starts "LO LOOP".

In other words, the level detection controller 514 generates a control signal containing a control signal value for increasing each gain of at least one of the VCO variable gain amplifier 510, the local variable gain amplifier 508 and the hybrid variable gain amplifiers 505a and 505b from the respective present gains by one step, and outputs the generated control signal to at least one of the VCO variable gain amplifier 510, the local variable gain amplifier 508 and the hybrid variable gain amplifiers 505a and 505b.

At least one of the VCO variable gain amplifier 510, the local variable gain amplifier 508 and the hybrid variable gain amplifiers 505a and 505b increases the respective present gains by one step, in response to the control signal generated by the level detection controller 514 (S2000).

The mixer 504a generates the in-phase transmission signal of a high frequency by performing quadrature modulation by using the in-phase analog baseband signal amplified by the baseband variable gain amplifier 507a and the in-phase local signal amplified by the hybrid variable gain amplifier 505a, and outputs the generated in-phase transmission signal to the power amplifier 503.

Further, the mixer 504b generates the orthogonal transmission signal of a high frequency by performing quadrature modulation by using the orthogonal analog baseband signal amplified by the baseband variable gain amplifier 507b and the orthogonal local signal amplified by the hybrid variable gain amplifier 505b, and outputs the generated orthogonal transmission signal to the power amplifier 503.

The power amplifier 503 amplifies the high-frequency transmission signal obtained by adding the in-phase transmission signal of a high frequency and the orthogonal transmission signal of a high frequency which are generated by the mixers 504a and 504b, and outputs the amplified transmission signal to the output terminal 501 through the coupler 502.

The power detector 513 detects the high-frequency transmission signal which is extracted by the coupler 502 (S2001), and outputs the power (level) of the high-frequency transmission signal which is the detected result, to the level detection controller 514.

The level detection controller 514 converts the power (level) of the analog high-frequency transmission signal which is the detected output of the power detector 513 into a digital value corresponding to the power (or level), and detects the output power POUT of the power amplifier 503 (S2002).

The level detection controller 514 compares the output power POUT of the power amplifier 503 with a predetermined reference output power Pdef (S2003). When the output power POUT of the power amplifier 503 is greater than the reference output power Pdef (in S2003, NO), the output power POUT of the power amplifier 503 exceeds the desired power, and thus the power control operation of the transmission signal in the wireless communication apparatus 1000 illustrated in FIG. 7 is ended.

In contrast, when it is determined that the output power POUT of the power amplifier 503 is smaller than the reference output power Pdef (in S2003, YES), the level detection controller 514 determines whether the LO gain, that is, each gain of at least one of the VCO variable gain amplifier 510, the local variable gain amplifier 508 and the hybrid variable gain amplifiers 505a and 505b is the upper limit value (S2004).

When the level detection controller 514 determines that each gain of at least one of the VCO variable gain amplifier 510, the local variable gain amplifier 508 and the hybrid variable gain amplifiers 505a and 505b is not the upper limit value (in S2004, NO), the operation of the wireless communication apparatus 1000 returns to step S2000.

In contrast, when the level detection controller 514 determines that each gain of at least one of the VCO variable gain amplifier 510, the local variable gain amplifier 508 and the hybrid variable gain amplifiers 505a and 505b is the upper limit value (in S2004, YES), the operation of the wireless communication apparatus 1000 is ended.

Thus, the wireless communication apparatus 1000 of the present embodiment performs, for example, "LO LOOP" after "VGA LOOP", such that even when the gains of the mixers 504a and 504b decrease due to the process variation, it is possible to obtain the desired output power of the power amplifier 503 by increasing the power of the local signals (the in-phase local signal and the orthogonal local signal) which are input to the mixers 504a and 504b.

In other words, even though the threshold voltage of the transistor varies due to the process variation from the desired value, the wireless communication apparatus 1000 can obtain the desired power of the high-frequency transmission signal.

Figure 8:
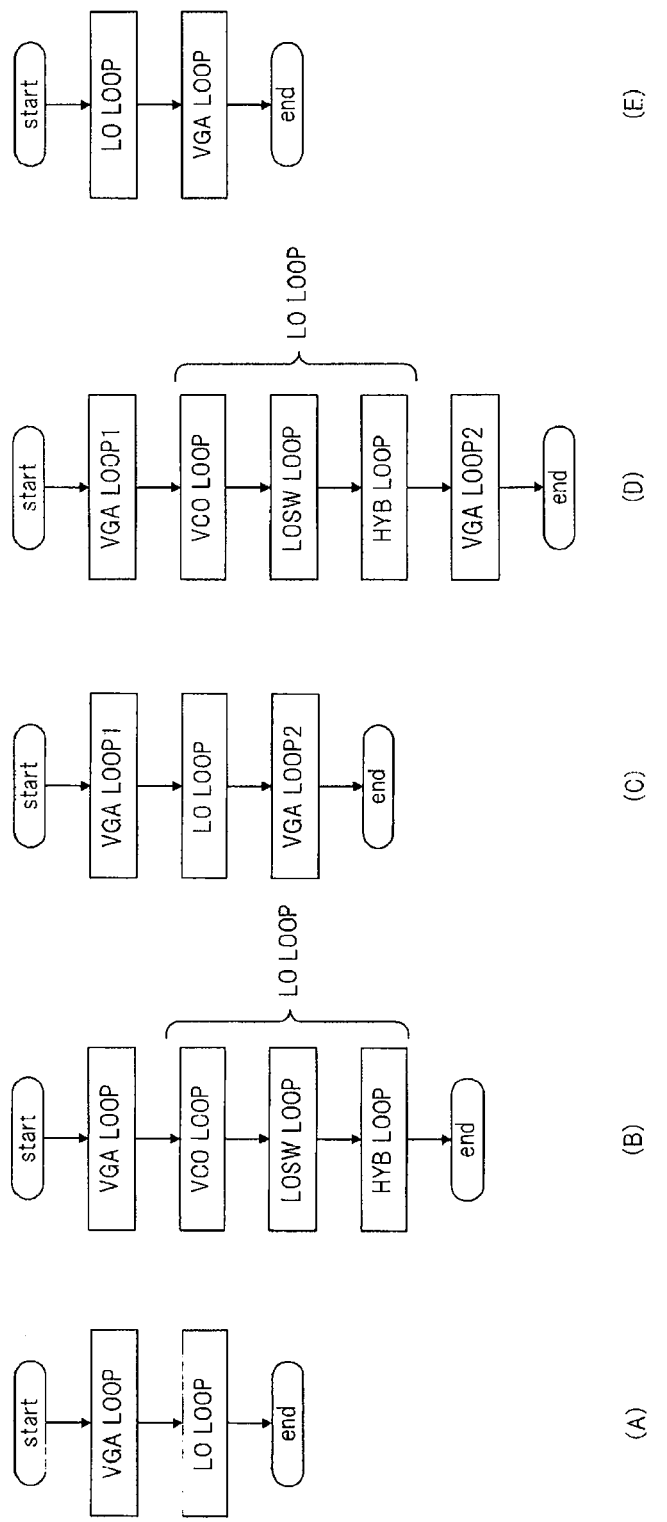
FIGS. 8(A) to (E) are flow charts simply describing another example of a power control operation of a transmission signal in the wireless communication apparatus of the first embodiment.

In addition, "LO LOOP" is performed after "VGA LOOP" as illustrated in FIG. 8(A) in the present embodiment, but, for example, "VGA LOOP" may be performed after "LO LOOP" as illustrated in FIG. 8(E).

Further, as long as the respective gains of the baseband variable gain amplifiers 507a and 507b and at least one of the VCO variable gain amplifier 510, the local variable gain amplifier 508 and the hybrid variable gain amplifiers 505a and 505b is changed, the change order of the respective gains is not limited. For example, the gain may be changed according to the order shown in FIG. 8(B) to FIG. 8(D).

Here, FIGS. 8(A) to 8(E) are flow charts simply describing other examples of a power control operation of a transmission signal in the wireless communication apparatus 1000 of the first embodiment. "VGA LOOP", "VGA LOOP1", and "VGA LOOP2" illustrated in FIGS. 8(A) to 8(E) represent the operation in which the respective gains of the baseband variable gain amplifiers 507a and 507b are changed according to "VGA LOOP" illustrated in FIG. 7. "VCO LOOP" illustrated in FIGS. 8(B) and 8(D) represents the operation in which the gain of the VCO variable gain amplifier 510 is changed according to "LO LOOP" illustrated in FIG. 7.

"LOSW LOOP" illustrated in FIGS. 8(B) and 8(D) represents the operation in which the gain of the local variable gain amplifier 508 is changed according to "LO LOOP" illustrated in FIG. 7. Further, "HYB LOOP" illustrated in FIGS. 8(B) and 8(D) represents the operation in which the gains of the hybrid variable gain amplifiers 505a and 505b are changed according to "LO LOOP" illustrated in FIG. 7.

"VCO LOOP", "LOSW LOOP", and "HYB LOOP" illustrated in FIG. 8(B) represents the operation in which each gain of at least one of the VCO variable gain amplifier 510, the local variable gain amplifier 508 and the hybrid variable gain amplifiers 505a and 505b is changed such that the output power of the local signals, or the in-phase local signal and the orthogonal local signal increases.

Thus, the wireless communication apparatus 1000 can increase the variable width of the input power of the in-phase local signal and the orthogonal local signal which are input to the mixers 504a and 504b.

Further, a description has been made in step S1004 and step S2004, illustrated in FIG. 7, assuming a case in which each gain increases up to an upper limit value, but a case of increasing the gain up to a predetermined setting value (for example, an intermediate value), without necessity of increasing the gain, especially, up to the upper limit value (see FIG. 8(C) or FIG. 8(D)) may also be assumed.

Figure 9:
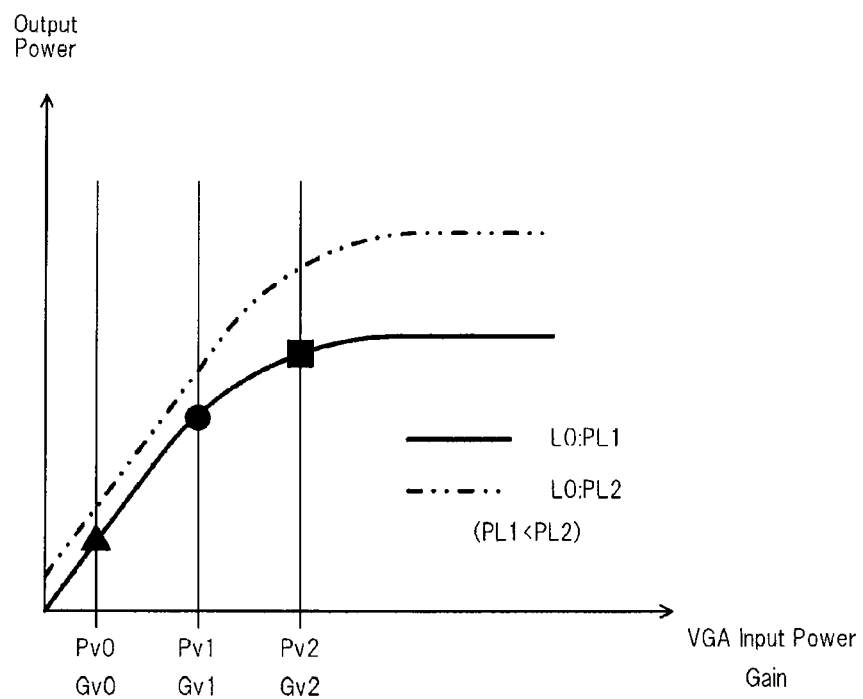
FIG. 9 is a graph illustrating power characteristics between a baseband signal which is input to the mixer and a high-frequency transmission signal which is output from the mixer.

FIG. 9 is a graph illustrating power characteristics between a baseband signal which is input to the mixers 504a and 504b and a high-frequency transmission signal which is output from the mixers 504a and 504b. The solid line shown in FIG. 9 represents the power characteristic when the input power of the local signal is PL1. The two-dot chain line shown in FIG. 9 represents the power characteristic when the input power of the local signal is PL2. It is assumed that the input power PL1< the input power PL2.

When the input power of the local signal is PL1, the gains of the baseband variable gain amplifiers 507a and 507b are increased from Gv0 to Gv1, and thus the input power of the baseband signals which are input to the mixers 504a and 504b increases from Pv0 to Pv1, but the mixers 504a and 504b start to be saturated at the vicinity of Pv1, and considerably saturated in the input power Pv2 corresponding to the gain Gv2, such that the characteristics of the mixers 504a and 504b are distorted.

Therefore, when the output power of the power amplifier 503 does not reach the desired power Po, the signal accuracy (for example, an error vector magnitude (EVM)) of the wireless communication apparatus 1000 deteriorates in some cases due to the distortion characteristics of the mixers 504a and 504b.

The wireless communication apparatus 1000 suppresses the saturation of the mixers 504a and 504b in the input power Pv1 of the baseband signal so as to cause the mixers 504a and 504b to operate linearly, by increasing the input power of the local signal from PL1 to PL2, and thus improves the linearity of the mixers 504a and 504b such that the mixers 504a and 504b are saturated at the vicinity of the input power Pv2 of the baseband signal. Thus, the wireless communication apparatus 1000 can obtain the desired power Po while securing the accuracy of the transmission signal.

Figure 10:
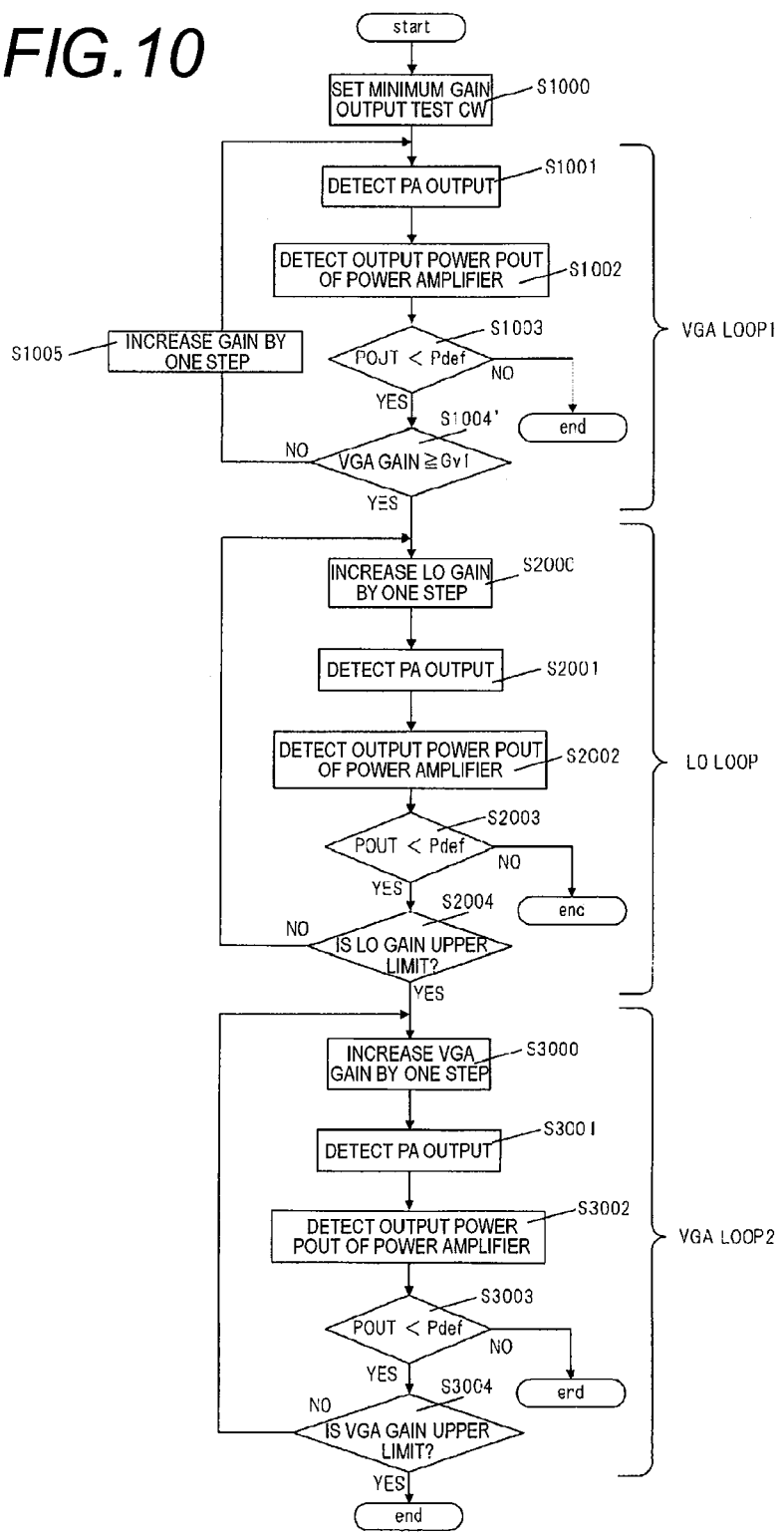
FIG. 10 is a flow chart describing the detailed contents of the power control operation of the transmission signal illustrated in FIG. 8(C).

Accordingly, as illustrated in FIG. 10, the wireless communication apparatus 1000 increases the gains of the baseband variable gain amplifiers 507a and 507b up to a predetermined setting value Gv1 in "VGA LOOP1" (S1004'), and performs the operation of "LO LOOP" at the time when the gains of the baseband variable gain amplifiers 507a and 507b reach the setting value Gv1.

FIG. 10 is a flow chart describing the detailed contents of the power control operation of the transmission signal illustrated in FIG. 8(C). Further, in the flow chart illustrated in FIG. 10, the same operations as those illustrated in FIG. 7 are denoted by the same reference numerals, such that the description thereof is omitted or simplified, and different contents will be described.

Further, even though the gain of at least one of the VCO variable gain amplifier 510, the local variable gain amplifier 508 and the hybrid variable gain amplifiers 505a and 505b is the upper limit value in "LO LOOP", when the output power of the power amplifier 503 does not reach the desired power Po, the wireless communication apparatus 1000 performs the operation of "VGA LOOP2".

Specifically, the level detection controller 514 generates a control signal containing a control signal value for increasing the respective gains of the baseband variable gain amplifiers 507a and 507b from the setting value Gv1 by one step and outputs the control signal to the baseband variable gain amplifiers 507a and 507b. The baseband variable gain amplifiers 507a and 507b increase the respective present gains (=the setting value Gv1) by one step, in response to the control signal generated by the level detection controller 514 (S3000).

The mixer 504a generates the in-phase transmission signal of a high frequency by performing quadrature modulation by using the in-phase analog baseband signal amplified by the baseband variable gain amplifier 507a and the in-phase local signal amplified by the hybrid variable gain amplifier 505a, and outputs the generated in-phase transmission signal to the power amplifier 503.

Further, the mixer 504b generates the orthogonal transmission signal of a high frequency by performing quadrature modulation by using the orthogonal analog baseband signal amplified by the baseband variable gain amplifier 507b and the orthogonal local signal amplified by the hybrid variable gain amplifier 505b, and outputs the generated orthogonal transmission signal to the power amplifier 503.

The power amplifier 503 amplifies the high-frequency transmission signal obtained by adding the in-phase transmission signal of a high frequency and the orthogonal transmission signal of a high frequency which are generated by the mixers 504a and 504b, and outputs the amplified transmission signal to the output terminal 501 through the coupler 502.

The power detector 513 detects the high-frequency transmission signal which is extracted by the coupler 502 (S3001), and outputs the power (level) of the high-frequency transmission signal which is the detected output, to the level detection controller 514.

The level detection controller 514 converts the power (level) of the analog high-frequency transmission signal which is the detected output of the power detector 513 into a digital value corresponding to the power (or level), and detects the output power POUT of the power amplifier 503 (S3002).

The level detection controller 514 compares the output power POUT of the power amplifier 503 with a predetermined reference output power Pdef (S3003). When the output power POUT of the power amplifier 503 is greater than the reference output power Pdef (in S3003, NO), the output power POUT of the power amplifier 503 exceeds the desired power, and thus the power control operation of the transmission signal in the wireless communication apparatus 1000 illustrated in FIG. 10 is ended.

In contrast, when it is determined that the output power POUT of the power amplifier 503 is smaller than the reference output power Pdef (in S3003, YES), the level detection controller 514 determines whether the VGA gain, that is, the respective gains of the baseband variable gain amplifiers 507a and 507b are the upper limit value (S3004). When the respective gains of the baseband variable gain amplifiers 507a and 507b are the upper limit value in step S3004 (in S3004, YES), the power control operation of the transmission signal of the wireless communication apparatus 1000 is ended.

When the respective gains of the baseband variable gain amplifiers 507a and 507b are not the upper limit value in step S3004 (in S3004, NO), the operation of the wireless communication apparatus 1000 returns to step S3000.

Further, a description has been made assuming that the wireless communication apparatus 1000 of the present embodiment changes the respective gains of the baseband variable gain amplifiers 507a and 507b, the VCO variable gain amplifier 510, the local variable gain amplifier 508, and the hybrid variable gain amplifiers 505a and 505b, but the gains of the mixers 504a and 504b, or the power amplifier 503 may be changed in addition thereto.

Although the wireless communication apparatus 1000 of the present embodiment uses a direct conversion system, without being necessary to be limited especially to the system, a system including a baseband variable gain amplifier and a local variable gain amplifier is preferable, and, for example, it is possible to achieve the same effect even with a heterodyne system.

(Second Embodiment)

In the first embodiment, a description has been made about the operation in which the wireless communication apparatus 1000 having a circuit configuration as a transmitter obtains the desired power Po which is the output power of the power amplifier 503, even though the threshold voltage of the transistor is changed from a desired value due to the occurrence of the process variation.

In the second embodiment, a description will be made about an operation in which a wireless communication apparatus 2000 having a circuit configuration as a transmitter and receiver obtains a desired power Po which is the output power of the power amplifier 503 in a transmission circuit and obtains a predetermined gain in a reception circuit, even though the threshold voltage of the transistor is changed from a desired value due to the occurrence of the process variation.

Figure 11:
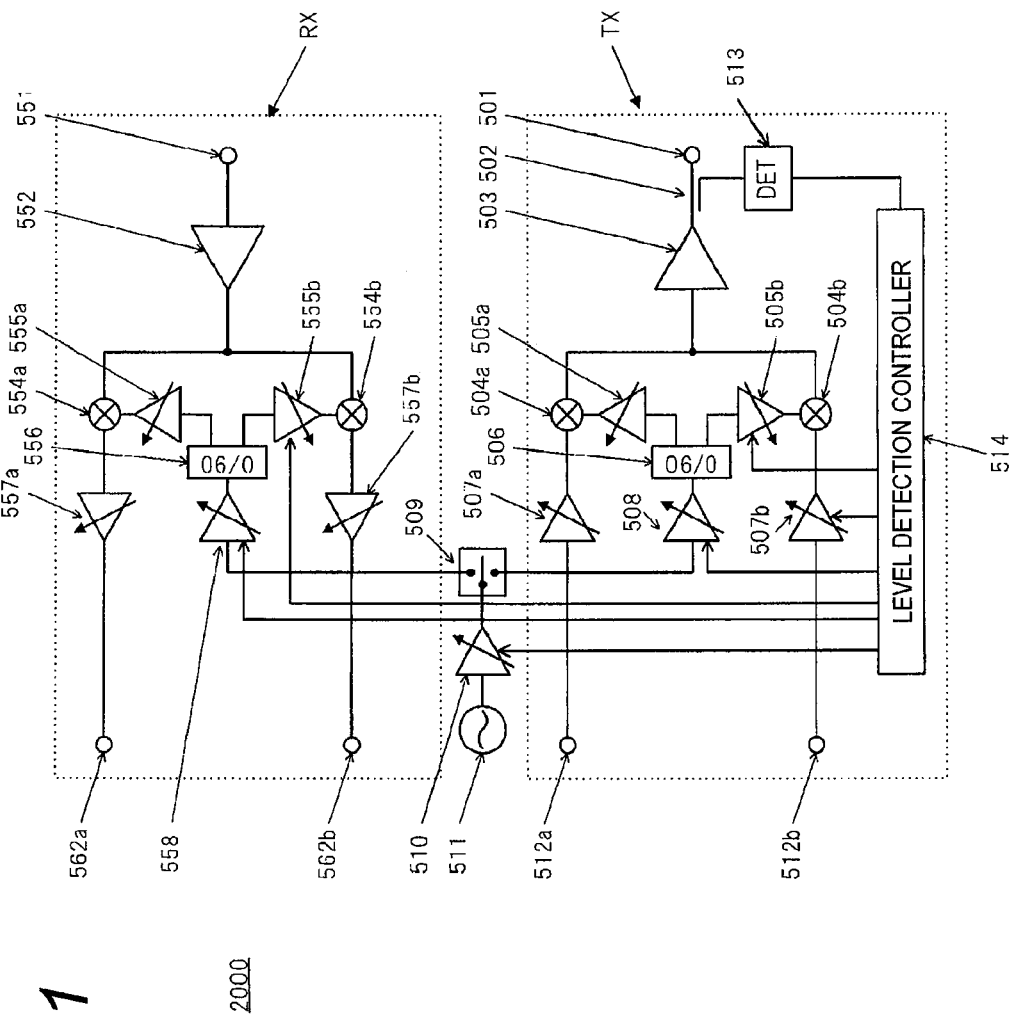
FIG. 11 is a diagram illustrating a circuit configuration of a wireless communication apparatus of a second embodiment.

FIG. 11 is a diagram illustrating a circuit configuration of the wireless communication apparatus 2000 of the second embodiment. The wireless communication apparatus 2000 illustrated in FIG. 11 includes a transmission circuit TX, a reception circuit RX, a voltage controlled oscillator 511, a VCO variable gain amplifier 510, and a local switch 509. In the circuit configurations illustrated in FIG. 11, the same circuit configurations as those illustrated in FIG. 1 are denoted by the same reference numerals, such that the description thereof is omitted, simplified, or supplemented, and different contents will be described.

The transmission circuit TX illustrated in FIG. 11 includes baseband variable gain amplifiers 507a and 507b, mixers 504a and 504b, the voltage controlled oscillator 511, the VCO variable gain amplifier 510, the local switch 509, a local variable gain amplifier 508, a 90-degree hybrid phase shifter 506, hybrid variable gain amplifiers 505a and 505b, a power amplifier 503, a coupler 502, a power detector 513, and a level detection controller 514.

The reception circuit RX illustrated in FIG. 11 includes a low noise amplifier (LNA) 552, mixers 554a and 554b, a local variable gain amplifier 558, a 90-degree hybrid phase shifter 556, hybrid variable gain amplifiers 555a and 555b, and baseband variable gain amplifiers 557a and 557b.

The LNA 552 receives a high-frequency reception signal as an input through an input terminal 551, and amplifies the received high-frequency reception signal. The amplified high-frequency reception signal branches into two and is input to the mixers 554a and 554b.

The local switch 509 outputs the local signal amplified by the VCO variable gain amplifier 510 to the local variable gain amplifier 508 or the local variable gain amplifier 558, in response to a control signal which is output by a control circuit, not shown.

In addition, the local switch 509 switches and outputs the local signal amplified by the VCO variable gain amplifier 510 to the transmission circuit or the reception circuit, but without providing the local switch 509, one voltage controlled oscillator 511 and one VCO variable gain amplifier 510 may be respectively provided for the transmission circuit TX and the reception circuit RX.

The local variable gain amplifier 558 amplifies the local signal amplified by the VCO variable gain amplifier 510, and outputs the amplified local signal to the 90-degree hybrid phase shifter 556, through the local switch 509. The local variable gain amplifier 558 changes the gain, in response to the control signal value of the control signal generated by the level detection controller 514.

The 90-degree hybrid phase shifter 556 generates an in-phase local signal and an orthogonal local signal of which the phases are orthogonal to each other, based on the local signal amplified by the local variable gain amplifier 558, and outputs the in-phase local signal to the hybrid variable gain amplifier 555a, and the orthogonal local signal to the hybrid variable gain amplifier 555b.

The hybrid variable gain amplifier 555a which is the hybrid variable gain amplifier amplifies the in-phase local signal generated by the 90-degree hybrid phase shifter 556, and outputs the amplified in-phase local signal to the mixer 554a. The hybrid variable gain amplifier 555a changes the gain, in response to the control signal value of the control signal generated by the level detection controller 514.

The hybrid variable gain amplifier 555b which is the hybrid variable gain amplifier amplifies the orthogonal local signal generated by the 90-degree hybrid phase shifter 556, and outputs the amplified orthogonal local signal to the mixer 554b. The hybrid variable gain amplifier 555b changes the gain, in response to the control signal value of the control signal generated by the level detection controller 514.

The mixer 554a which is the reception mixer generates an in-phase analog baseband reception signal by performing quadrature demodulation by using the analog high-frequency reception signal which is amplified by the LNA 552 and the in-phase local signal amplified by the hybrid variable gain amplifier 555a, and outputs the generated in-phase analog baseband reception signal to the baseband variable gain amplifier 557a.

The mixer 554b which is the reception mixer generates an orthogonal analog baseband reception signal by performing quadrature demodulation by using the analog high-frequency reception signal which is amplified by the LNA 552 and the orthogonal local signal amplified by the hybrid variable gain amplifier 555b, and outputs the generated orthogonal analog baseband reception signal to the baseband variable gain amplifier 557b.

The baseband variable gain amplifiers 557a and 557b which are the reception baseband variable gain amplifier receive and amplify the in-phase analog baseband reception signal and the orthogonal analog baseband reception signal. The in-phase analog baseband signal and the orthogonal analog baseband signal which are amplified are respectively output to the output terminals 562a and 562b, and input to the respective analog digital converters (ADC), not shown.

The level detection controller 514 which is the controller outputs a control signal containing a control signal value for setting each gain after the change, with respect to each variable gain amplifier to be changed in which the gain is changed, of at least one of the local variable gain amplifier 508 and the hybrid variable gain amplifiers 505a and 505b in the transmission circuit TX, to at least one of the local variable gain amplifier 558 and the hybrid variable gain amplifiers 555a and 555b in the reception circuit RX.

In other words, the level detection controller 514 uses the control signal value for setting each gain after the change, with respect to each variable gain amplifier to be changed in which the gain is changed, among the local variable gain amplifier 508 and the hybrid variable gain amplifiers 505a and 505b in the transmission circuit TX, as the control signal value for setting the gain after the change, with respect to each variable gain amplifier to be changed in which the gain is changed, among the local variable gain amplifier 558 and the hybrid variable gain amplifiers 555a and 555b in the reception circuit RX.

Thus, the level detection controller 514, similarly to the transmission circuit TX of the wireless communication apparatus 2000, can adjust the input power of the local signal that is input to the mixers 554a and 554b to be an appropriate target value, even in the reception circuit RX of the wireless communication apparatus 2000, by changing the gain of at least one of the local variable gain amplifier 558 and the hybrid variable gain amplifiers 555a and 555b.

Figure 12:
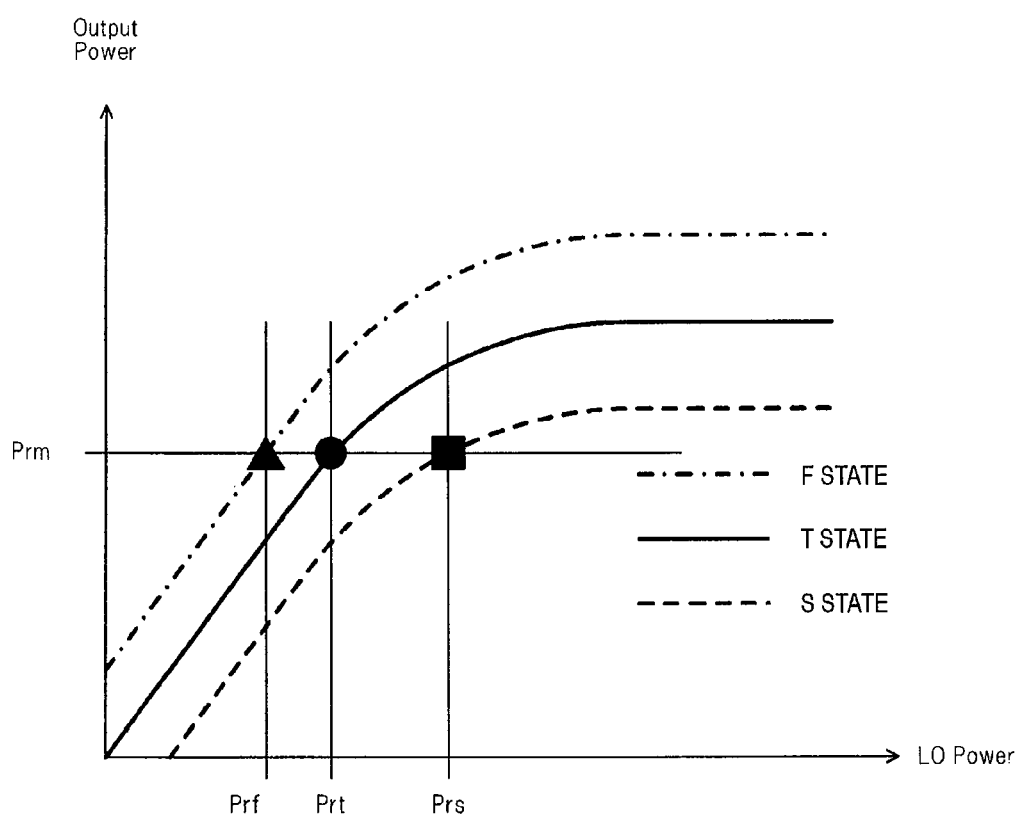
FIG. 12 is a graph illustrating power characteristics between a local signal which is input to a mixer of a reception circuit and a baseband signal which is output from the mixer.

FIG. 12 is a graph illustrating power characteristics between a local signal which is input to the mixers 554a and 554b in the reception circuit RX and a baseband signal which is output from the mixers 554a and 554b. The solid line shown in FIG. 12 represents the power characteristic at the T state in which the threshold voltage Vth of the transistor used in the mixers 554a and 554b is a typical value (center value). The dash-dot line shown in FIG. 12 represents the power characteristic at the F state in which the threshold voltage Vth of the transistor used in the mixers 554a and 554b is a low value. The dotted line shown in FIG. 12 represents the power characteristic at the S state in which the threshold voltage Vth of the transistor used in the mixers 554a and 554b is a high value.

In FIG. 12, similarly to the mixers 504a and 504b in the transmission circuit TX, the characteristics of the output power of the baseband signals are different with respect to the input power of the local signals which are input to the mixers 554a and 554b in the reception circuit RX, due to the process variation.

Specifically, when it is assumed that the input power of the local signal is Prt, the output power is a target power Prm at the T state, but the output power is higher than the target power Prm at the F state, and is lower than the target power Prm at the S state. In other words, when the input power of the local signal is constant, the threshold voltage Vth of the transistor at the S state is high, and the maximum operating frequency fmax decreases; whereas when the operation frequency in the wireless communication circuit using a millimeter-wave band is not sufficiently low (for example, more than 1/10) compared to fmax, each gain of the mixers 554a and 554b decreases at the S state.

In other words, when the wireless communication apparatus 2000 of the present embodiment is configured with a CMOS of a single chip (one chip), both the transmission circuit TX and the reception circuit RX are similarly affected by the process variation in some cases. For example, when the chip is in the F state, the transmission circuit TX and the reception circuit RX which are formed on the chip are similarly in the F state, and the characteristics of the transistor used in the transmission circuit TX and the reception circuit RX are in the F state.

Thus, in the present embodiment, the wireless communication apparatus 2000 uses the setting value of the input power of the local signal which is input to the mixers 504a and 504b in the transmission circuit TX as the setting value of the input power of the local signal which is input to the mixers 554a and 554b in the reception circuit RX.

In other words, the wireless communication apparatus 2000 uses the control signal value for setting each gain after the change, with respect to each variable gain amplifier to be changed in which the gain is changed, among the local variable gain amplifier 508 and the hybrid variable gain amplifiers 505a and 505b, as the control signal value for setting each gain after the change, with respect to each variable gain amplifier to be changed in which the gain is changed, among the local variable gain amplifier 558 and the hybrid variable gain amplifiers 555a and 555b.

Thus, even though the mixers 504a and 504b in the transmission circuit TX and the mixers 554a and 554b in the reception circuit RX are similarly affected by the process variation, the wireless communication apparatus 2000 can obtain constant gains not only in the mixers 504a and 504b in the transmission circuit TX, but also in the mixers 554a and 554b in the reception circuit RX.

In addition, the wireless communication apparatus 2000 may not use the same value as the control signal value for setting each gain after the change, with respect to each variable gain amplifier to be changed in which the gain is changed, among the local variable gain amplifier 508 and the hybrid variable gain amplifiers 505a and 505b, as the control signal value for setting each gain after the change, with respect to each variable gain amplifier to be changed in which the gain is changed, among the local variable gain amplifier 558 and the hybrid variable gain amplifiers 555a and 555b.

For example, the wireless communication apparatus 2000 may use a value lower or higher by a predetermined value than the control signal value for setting each gain after the change, with respect to each variable gain amplifier to be changed in which the gain is changed, among the local variable gain amplifier 508 and the hybrid variable gain amplifiers 505a and 505b, as the control signal value for setting each gain after the change, with respect to each variable gain amplifier to be changed in which the gain is changed, among the local variable gain amplifier 558 and the hybrid variable gain amplifiers 555a and 555b. This is because the output power characteristics with respect to the input power of the respective local signals of the mixers 504a and 504b in the transmission circuit TX and the mixers 554a and 554b in the reception circuit RX do not necessarily coincide.

Figure 13:
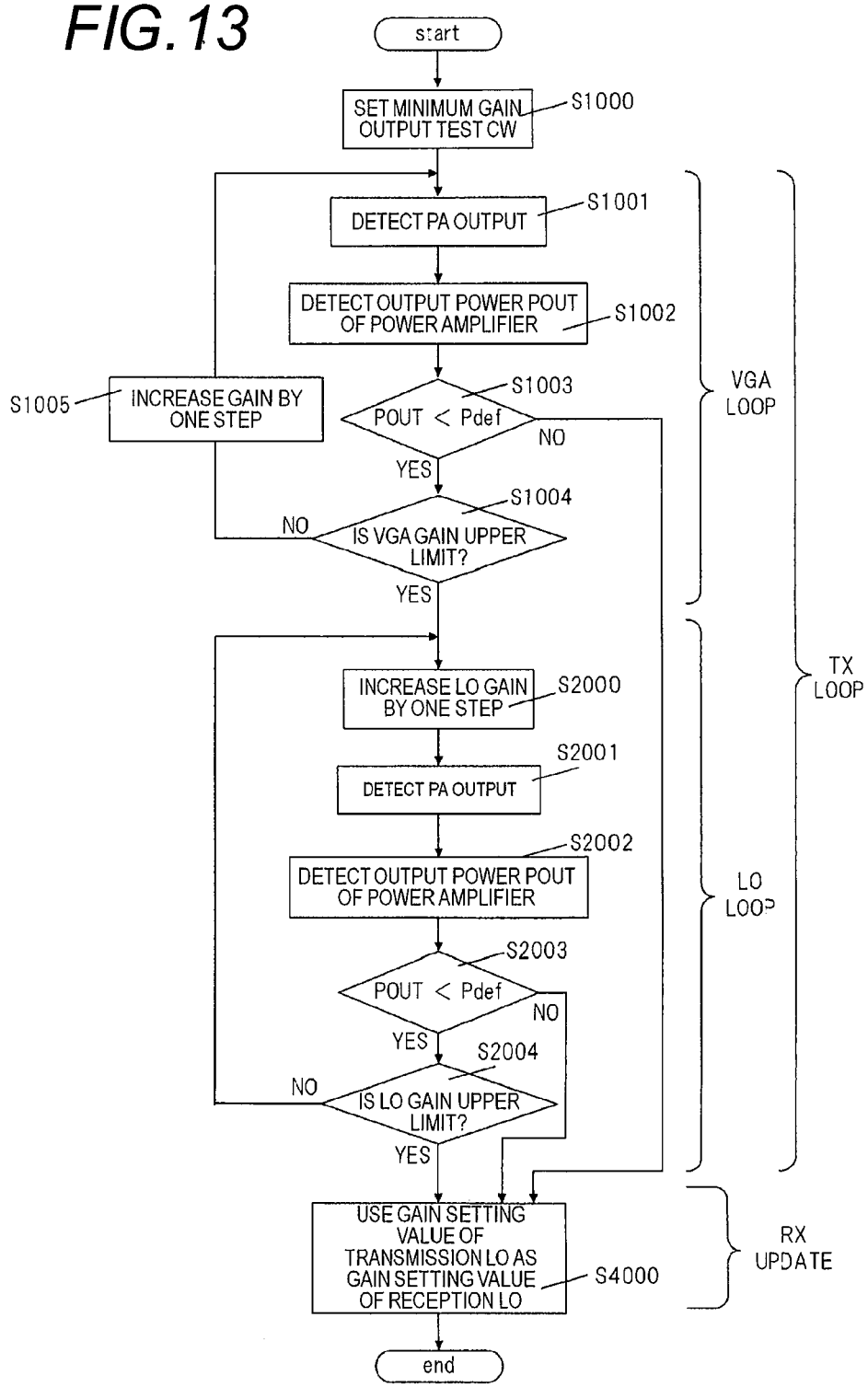
FIG. 13 is a flow chart describing the detailed contents of a power control operation of a transmission signal in the wireless communication apparatus of the second embodiment.

FIG. 13 is a flow chart describing the detailed contents of the power control operation of the transmission signal of the wireless communication apparatus 2000 of the second embodiment. Further, in the flow chart illustrated in FIG. 13, the same operations as those illustrated in FIG. 7 are denoted by the same reference numerals, such that the description thereof is omitted or simplified, and different contents will be described.

In FIG. 13, an operation ("TX LOOP") for changing each gain for amplifying the baseband signal and local signal which are input to the mixers 504a and 504b in the transmission circuit TX is "VGA LOOP" and "LO LOOP" of step S1000 to step S2004, and is the same as step S1000 to step S2004 illustrated in FIG. 7, and thus the description thereof is omitted.

In the present embodiment, the wireless communication apparatus 2000, after step S2004, uses a transmission local gain setting value, that is, the same value as the control signal value for setting each gain after the change, with respect to each variable gain amplifier to be changed in which the gain is changed, among the local variable gain amplifier 508 and the hybrid variable gain amplifiers 505a and 505b, as the control signal value for setting each gain after the change, with respect to each variable gain amplifier to be changed in which the gain is changed, among the local variable gain amplifier 558 and the hybrid variable gain amplifiers 555a and 555b (S4000, RXUPDATE).

In addition, in FIG. 13, "TX LOOP" is "VGA LOOP" and "LO LOOP", but may be, for example, each operation illustrated in FIG. 8(B) to FIG. 8(D).

Thus, the wireless communication apparatus 2000 of the present embodiment uses the setting value of the input power of the local signal that is input to the mixers 504a and 504b in the transmission circuit TX, that is, the control signal value for setting each gain after the change, with respect to each variable gain amplifier to be changed in which the gain is changed, among the local variable gain amplifier 508 and the hybrid variable gain amplifiers 505a and 505b, as the setting value of the input power of the local signal that is input to the mixers 554a and 554b in the reception circuit RX, that is, the control signal value for setting each gain after the change, with respect to each variable gain amplifier to be changed in which the gain is changed, among the local variable gain amplifier 558 and the hybrid variable gain amplifiers 555a and 555b.

Thus, the wireless communication apparatus 2000 can obtain the desired power Po which is the output power of the power amplifier 503 in the transmission circuit TX, even though the threshold voltage of the transistor used in the transmission circuit TX is changed from a desired value (a typical value or a center value) due to the occurrence of the process variation. Further, the wireless communication apparatus 2000 can obtain a constant gain in the reception circuit RX by using the same value as the control signal value or a value lower or higher by a predetermined value than the control signal value for setting each gain after the change, with respect to each variable gain amplifier to be changed in which the gain is changed, among the local variable gain amplifier 508 and the hybrid variable gain amplifiers 505a and 505b, even though the threshold voltage of the transistor used in the reception circuit RX is changed from a desired value (a typical value or a center value) due to the occurrence of the process variation.

The above has described various embodiments with reference to the drawings, but it goes without saying that the present disclosure is not limited to such examples. It is apparent that a person skilled in the art can conceive various changes and modifications within the range of the claims, and it is understood that those belong to the technical scope of the present disclosure.

The present application is based on Japanese Patent Application No. 2013-049363 filed on Mar. 12, 2013, the contents of which are incorporated herein by reference.

INDUSTRIAL APPLICABILITY

The present disclosure is useful as a transceiver using a high frequency, particularly, a millimeter wave band that reduces the transmission power change due to process variation, and outputs stable transmission power.

REFERENCE SIGNS LIST

502: COUPLER
503: POWER AMPLIFIER
504a, 504b, 554a, 554b: MIXER
505a, 505b, 555a, 555b: HYBRID VARIABLE GAIN AMPLIFIER
506, 556: 90-DEGREE HYBRID PHASE SHIFTER
507a, 507b, 557a, 557b: BASEBAND VARIABLE GAIN AMPLIFIER
508, 558: LOCAL VARIABLE GAIN AMPLIFIER
509: LOCAL SWITCH
510: VCO VARIABLE GAIN AMPLIFIER
511: VOLTAGE CONTROLLED OSCILLATOR (VCO)
513: POWER DETECTOR (DET)
514: LEVEL DETECTION CONTROLLER

552: LNA
1000, 2000: WIRELESS COMMUNICATION APPARATUS

The invention claimed is:

1. A wireless communication device comprising:
a transmission baseband variable gain amplifier that amplifies a transmission baseband signal;
a transmission mixer that converts the amplified transmission baseband signal into a high-frequency transmission signal;
a transmission local variable gain amplifier that amplifies a local oscillation signal of a predetermined frequency that is input to the transmission mixer; and
a controller that changes respective gains of the transmission baseband variable gain amplifier and the transmission local variable gain amplifier, in response to power of the high-frequency transmission signal.

2. The wireless communication device according to claim 1, further comprising:
a phase shifter that generates an in-phase local oscillation signal and an orthogonal local oscillation signal which are orthogonal to each other, based on the local oscillation signal, wherein
the transmission local variable gain amplifier includes:
a first hybrid variable gain amplifier that amplifies the in-phase local oscillation signal; and
a second hybrid variable gain amplifier that amplifies the orthogonal local oscillation signal.

3. The wireless communication device according to claim 1, further comprising:
a voltage controlled oscillator (VCO) that generates the local oscillation signal, wherein
the transmission local variable gain amplifier includes a VCO variable gain amplifier that amplifies the generated local oscillation signal.

4. The wireless communication device according to claim 1, wherein
the controller changes respective gains of the transmission baseband variable gain amplifier and the transmission local variable gain amplifier in this order.

5. The wireless communication device according to claim 1, wherein
the controller changes the gain of the transmission baseband variable gain amplifier from an initial value up to a first predetermined setting value,
the controller changes the gain of the transmission local variable gain amplifier from an initial value up to a second predetermined setting value or an upper limit value, and
the controller changes the gain of the transmission baseband variable gain amplifier from the first predetermined setting value.

6. A wireless communication device comprising:
a transmission circuit that generates a high-frequency transmission signal by using a local oscillation signal and a transmission baseband signal;
a reception circuit that generates a baseband reception signal by using a high-frequency reception signal and the local oscillation signal; and
a controller that changes a first gain for amplifying the transmission baseband signal and a second gain for amplifying the local oscillation signal, in response to power of the high-frequency transmission signal, wherein
the controller uses a first control signal value that sets the changed second gain for amplifying the local oscillation signal, which is input to the transmission circuit, or a value obtained by adding or subtracting a predetermined value to or from the first control signal value, as a second control signal value that sets the second gain for amplifying the local oscillation signal, which is input to the reception circuit.

7. The wireless communication device according to claim 6, wherein the transmission circuit includes:
a transmission baseband variable gain amplifier that amplifies the transmission baseband signal;
a transmission mixer that converts the amplified transmission baseband signal into the high-frequency transmission signal; and
a transmission local variable gain amplifier that amplifies the local oscillation signal which is input to the transmission mixer, wherein
the reception circuit includes:
a reception mixer that converts the high-frequency reception signal into the baseband reception signal; and
a reception local variable gain amplifier that amplifies the local oscillation signal which is input to the reception mixer, and wherein
the controller uses a third control signal value that sets a changed gain of the transmission local variable gain amplifier, or a value obtained by adding or subtracting a predetermined value to or from the third control signal value, as a fourth control signal value that sets a gain of the reception local variable gain amplifier.

8. The wireless communication device according to claim 7, further comprising:
a phase shifter that generates an in-phase local oscillation signal and an orthogonal local oscillation signal which are orthogonal to each other, based on the local oscillation signal, wherein
the transmission local variable gain amplifier includes:
a first hybrid variable gain amplifier that amplifies the in-phase local oscillation signal; and
a second hybrid variable gain amplifier that amplifies the orthogonal local oscillation signal, and wherein
the reception local variable gain amplifier includes:
a third hybrid variable gain amplifier that amplifies the in-phase local oscillation signal; and
a fourth hybrid variable gain amplifier that amplifies the orthogonal local oscillation signal.

9. The wireless communication device according to claim 7, further comprising:
a voltage controlled oscillator (VCO) that generates the local oscillation signal, wherein
the transmission local variable gain amplifier and the reception local variable gain amplifier commonly use a VCO variable gain amplifier that amplifies the generated local oscillation signal.

10. The wireless communication device according to claim 6, wherein
the transmission circuit and the reception circuit are integrated into a single chip.

* * * * *